United States Patent [19]
Okazaki

[11] Patent Number: 5,825,118
[45] Date of Patent: Oct. 20, 1998

[54] VIBRATION ACTUATOR

[75] Inventor: Mitsuhiro Okazaki, Kawasaki, Japan

[73] Assignee: Nikon Corporation, Tokyo, Japan

[21] Appl. No.: 866,325

[22] Filed: May 30, 1997

[30] Foreign Application Priority Data

May 30, 1996 [JP] Japan .................................. 8-136617

[51] Int. Cl.$^6$ .................................................. H01L 41/08
[52] U.S. Cl. ........................................................... 310/323
[58] Field of Search ..................................... 310/323, 328

[56] References Cited

U.S. PATENT DOCUMENTS

| | | | |
|---|---|---|---|
| 4,458,536 | 7/1984 | Ahn et al. ................................ | 73/652 |
| 4,649,311 | 3/1987 | Mukohjima et al. ................... | 310/323 |
| 4,965,482 | 10/1990 | Ohnishi et al. ......................... | 310/323 |
| 5,051,647 | 9/1991 | Uchikawa et al. ...................... | 310/323 |
| 5,124,611 | 6/1992 | Tamai et al. ............................. | 310/317 |
| 5,245,243 | 9/1993 | Ohnishi et al. ......................... | 310/323 |
| 5,646,469 | 7/1997 | Tsukimoto et al. ..................... | 310/323 |

FOREIGN PATENT DOCUMENTS

| | | |
|---|---|---|
| 0 674 350 A1 | 9/1995 | European Pat. Off. . |
| 0 696 072 A1 | 2/1996 | European Pat. Off. . |
| 8-103089 | 4/1996 | Japan . |
| 8-140377 | 5/1996 | Japan . |
| 8-242593 | 9/1996 | Japan . |

OTHER PUBLICATIONS

U.S. Ser. No. 08/648,515, filed Apr. 30, 1996, Takatoshi Ashizawa, Nikon Corporation.
U.S. Ser. No. 08/659,828, filed Jun. 7, 1996, Takatoshi Ashizawa, Nikon Corporation.
U.S. Ser. No. 08/685,429, filed Jul. 24, 1996, Daisuke Saya, Nikon Corporation.
U.S. Ser. No. 08/701,673, filed Aug. 22, 1996, Takatoshi Ashizawa, et al., Nikon Corporation.
U.S. Ser. No. 08/716,867, filed Sep. 12, 1996, Mitsuhiro Okazaki et al., Nikon Corporation.
U.S. Ser. No. 08/715,471, filed Sep. 18, 1996, Takatoshi Ashizawa et al., Nikon Corporation.
U.S. Ser. No. 08/391,565, filed Feb. 21, 1995, Takatoshi Ashizawa et al., Nikon Corporation.
U.S. Ser. No. 08/408,305, filed Mar. 22, 1995, Takatoshi Ashizawa et al., Nikon Corporation.
U.S. Ser. No. 08/509,818, filed Aug. 1, 1995, Yoshiro Tomikawa et al., Nikon Corporation.
U.S. Ser. No. 08/760,371, filed Dec. 4, 1996, Isao Sugaya et al., Nikon Corporation.
U.S. Ser. No. 08/580,973, filed Jan. 3, 1996, Mitsuhiro Okazaki et al., Nikon Corporation.
U.S. Ser. No. 08/781,054, filed Jan. 9, 1997, Kazuyasu Oone et al., Nikon Corporation.

*Primary Examiner*—Mark O. Budd

[57] ABSTRACT

A vibration actuator combines plural elastic members and vibration elements to generate torsional vibrations about an axis and longitudinal vibrations in an axial direction. The vibration actuator includes a fixed member passing through a hollow portion of a plurality of vibration elements and supports the vibration elements within a gap in an inner surface of the vibration elements. A combination of semi-cylindrical members generate a second order torsional vibration around the axis and a first order longitudinal vibration in the axial direction of the vibration actuator. The fixed shaft also passes through a hollow portion of the vibration element. The vibration element and the fixed shaft are affixed by a pin, thereby eliminating a need for a more restrictive connection with bolts. Thus, vibration restriction of the vibration actuator is enhanced and driving efficiency is increased.

20 Claims, 10 Drawing Sheets

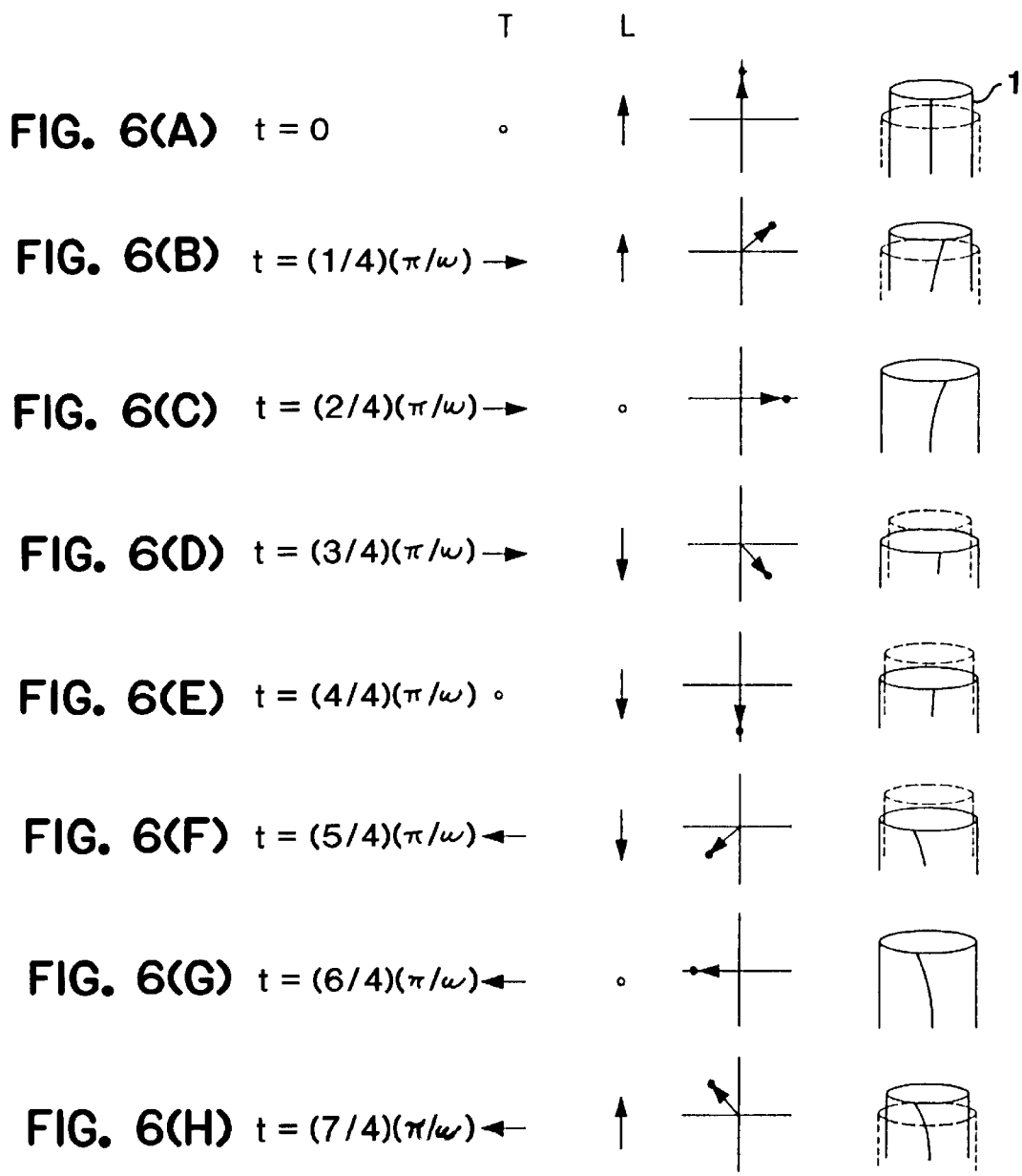

VIBRATION ACTUATOR

CROSS-REFERENCE TO RELATED APPLICATIONS

This application is based upon and claims priority of Japanese Patent Application No. 08-136617, filed May 30, 1996, the contents being incorporated herein by reference.

BACKGROUND OF THE INVENTION

The present invention relates to vibration actuators which combine plural elastic members and vibration elements to generate torsional vibration around an axis and longitudinal vibrations in an axial direction. More particularly, the present invention relates to vibration actuators which include a fixed member passing through a hollow portion of a plurality of vibration elements and supporting the vibration elements in a state forming a gap with respect to an inner surface of the vibration elements.

Vibration actuators have characterizing features of small size, light weight, low speed and high torque. Vibration actuators are also being designed and put to practical use in a succession of various manufactured articles including cameras. Thus, the development of vibration actuators has become very active in recent years.

FIG. 13 is an exploded perspective view of a conventional torsional-vibrational type of vibration actuator. Heretofore, in this kind of vibration actuator, a fixed element in the form of stator 101 is arranged with a piezoelectric element 104 for torsional vibration. Piezoelectric element 104 is interposed between two cylindrical vibration elements 102, 103. Moreover, a piezoelectric element 105 for longitudinal vibration is located on an upper side of vibration element 103. Piezoelectric element 104 for torsional vibration is polarized in a circumferential direction. On the other hand, piezoelectric element 105 for longitudinal vibration is polarized in a thickness direction. A moving element 106 is in the form of a rotor and is located on an upper side of vibration element 105.

Vibration elements 102, 103 and piezoelectric elements 104, 105 which form stator 101 are affixed by screwing onto a threaded portion of a shaft 107. Moreover, a moving element 106 is rotatably disposed about shaft 107 via ball bearing 108. Nut 110 is screwed onto a threaded end of shaft 107 via spring 109, and moving element 106 is thereby maintained in compressive contact with stator 101 by a compression force F.

Piezoelectric element 104 for torsional vibration and piezoelectric element 105 for longitudinal vibration are driven by phase control of a phase shifter 112. Phase shifter 112 provides a constant frequency voltage which is generated from an oscillator 111.

Piezoelectric element 104 rotates moving element 106 through mechanical deformation. On the other hand, piezoelectric element 105 causes a frictional force between fixed element 101 and moving element 106 to change periodically, synchronized with a period of torsional vibration caused by piezoelectric element 104. Thus, piezoelectric element 105 functions as a clutch which converts vibration into a motion in one direction.

FIG. 14 is an exploded perspective view of conventional stator 101. In conventional stator 101, it is necessary to polarize piezoelectric element 104 in a circumferential direction. Consequently, piezoelectric material, as illustrated in FIG. 14, is generally divided into about six (6) to eight (8) fan-shaped sections. After each section has been polarized, the sections are combined into an annulus. As illustrated, reference numeral 104a denotes an electrode.

However, in the aforementioned conventional vibration actuator, it is difficult to ensure a proper annular form during assembly of piezoelectric element 104.

On the other hand, respective areas of piezoelectric element 105 and piezoelectric element 104 are approximately equal to a cross sectional area of moving element 106, or are smaller than a cross sectional area of moving element 106. Moreover, in order to pass shaft 107 therethrough, it is necessary to open a hole through respective center portions of piezoelectric element 105 and piezoelectric element 104. Accordingly, respective areas of piezoelectric element 105 and piezoelectric element 104 become a step smaller, and it is therefore difficult to design a vibration actuator with both high torque and high rotation.

In order to solve such problems, the applicants were able to drive a vibration actuator at high torque and high rotational speed, as set forth in Japanese Patent Publication 6-275022. The applicants proposed a vibration actuator having a simple structure and simple method of manufacture using degenerate modes of different form.

FIG. 15 is a cross sectional view of a vibration actuator using degenerate modes of different form. FIG. 16 is an elevated perspective view of vibration element 152 extracted from the vibration actuator of FIG. 15.

Vibration element 152 is an elastic member of hollow cylindrical form and is disposed about an external circumferential surface of a cylindrical fixed shaft 151. Vibration element 152 is screwed onto an approximate central portion 151a of fixed shaft 151 by way of mounting bolts 153a, 153b.

Vibration element 152, as illustrated in FIGS. 15 and 16, is formed by assembling two thick, semicylindrical elastic members 152a, 152b. Two piezoelectric elements 154 are provided for each semicylindrical elastic member, for a total of four piezoelectric elements. The piezoelectric elements 154 are used for torsional vibration. Piezoelectric elements 154 have a piezoelectric constant of $d_{15}$. Piezoelectric elements 155 are used to generate longitudinal vibration and have a piezoelectric constant of $d_{31}$. Piezoelectric elements 155 are interposed between semicylindrical elastic members 152a and 152b along with piezoelectric elements 154.

As illustrated in FIG. 15, moving element 157 is a relative motion member which is rotatably located on cylindrical fixed shaft 151 by a bearing 156 which is centrally located. Moving element 157 contacts driving surface D of an upper end face of vibration element 152.

Moving element 157 includes a thick annular moving element base material 157a and a sliding material 157b which is in contact with the driving surface D of vibration element 152. The position of cylindrical fixed shaft 151 is set with respect to moving element 157 by fitting bearing 156 into moving element base material 157a.

Moreover, moving element 157 is in compressive contact, by a suitable contact force, with driving surface D of vibration element 152. The contact force is provided through a spring force of conical disk spring 158 (which may be a coil spring or a plate spring).

In this manner, cylindrical fixed shaft 151 fixes and maintains vibration element 152. In addition, fixed shaft 151 sets a position of the moving element 157 in a radial direction while allowing free rotation, and prevents the generation of axial vibration during driving as a vibration actuator. A threaded portion 151b is disposed at an end of cylindrical fixed shaft 151. A nut 159 is screwed onto threaded portion 151b and functions as a compressive force adjusting member in order to regulate the compressive force of conical disk spring 158.

The above vibration actuator harmonically generates torsional vibrations and longitudinal vibrations in vibration element 152 through the excitation of piezoelectric elements 154 and 155 with driving voltages from a driving voltage generation device (not shown). When resonant frequencies of the torsional vibration and the longitudinal vibration approximately coincide, the torsional vibrations and the longitudinal vibrations occur simultaneously and are combined in the driving surface D to periodically generate elliptic motion. This elliptic motion becomes a driving force and moving element 157, which is in compressive contact, is rotationally driven about cylindrical fixed shaft 151.

In the vibration actuator of FIG. 15, vibration element 152 includes an assembly of semicylindrical elastic members 152a, 152b and piezoelectric elements 154, 155. The resonant mode which is excited, is set primarily by the dimensions, shape and material constants, etc., of vibration element 152, by utilizing a large amplitude generated in vibration element 152.

This kind of vibration actuator excites plural vibrations in vibration actuator 152 which are output as a driving force. Accordingly, in order to obtain a high efficiency, it is necessary for the vibration amplitude generated in vibration element 152 to be transmitted as efficiently as possible to moving element 157. Moreover, it becomes necessary to perform a certain degree of registration in order to perform accurate position setting of vibration element 152 by cylindrical fixed shaft 151. Further, it is necessary to maintain a fixed area in order to maintain vibration element 152, etc. Because of this, heretofore, vibration element 152 was fixed by firmly tightening vibration element 152 to fixed shaft 151 by way of bolts 153a, 153b.

In the vibration actuator using degenerate modes of different form proposed in Japanese Patent Publication 6-275022, in order to output the driving force by way of transmission to moving element 157, it is necessary to reliably support vibration element 152 in the rotation direction, namely around cylindrical fixed shaft 151 in FIG. 15, and in the compression direction, namely the axial direction of cylindrical fixed shaft 151.

However, while fixing the vibration element 152 (constituted by elastic elements 152a, 152b and electromechanical converting elements 154, 155) by a support configuration, i.e a support means, a support position, a support force, and the like of elastic elements 152a, 152b, there is a risk of increased restriction of vibration with respect to semicylindrical elastic elements 152a, 152b, and a reduction in amplitude. Thus, a decrease in the driving efficiency of the vibration actuator results.

As illustrated in FIG. 15, heretofore, the vibration restriction of semicylindrical elastic elements 152a, 152b becomes large, due to mounting bolts 153a, 153b being screwed to cylindrical fixed shaft 151 and passing through elastic elements 152a, 152b. As a result, the driving efficiency of the vibration actuator is decreased.

BRIEF SUMMARY OF THE INVENTION

It is therefore an object of the present invention to solve the above-mentioned problems of a vibration actuator by not affixing an elastic vibration element to a fixed shaft using bolts.

It is a further object of the invention to provide a vibration actuator having an elastic vibration element separately located from a fixed shaft.

Moreover, it is an object of the present invention to provide a vibration actuator having an elastic vibration element and a fixed shaft which are secured by pins.

Objects of the invention are achieved by a vibration actuator, including a hollow rod-shaped vibration element having an inner surface defined along an axis, the vibration element generating torsional vibration around the axis, having at least one node, and longitudinal vibration in the axial direction, having at least one node; a fixed member passing through the vibration element, wherein the fixed member is arranged to have a gap with respect to the vibration element; a relative motion member in compressive contact with an end surface of the vibration element; and a support member to connect the vibration element to the fixed member, wherein the support member passes through the vibration element and the fixed member, and elastically deforms in the gap.

Further objects of the invention are achieved by a vibration actuator, including a hollow rod-shaped vibration element having an inner surface defined along an axis, the vibration element to generate a second order torsional vibration around the axis and a first order longitudinal vibration in the axial direction; a fixed member passing through the vibration element, wherein the fixed member is arranged to have a gap with respect to the vibration element; a relative motion member in compressive contact with an end surface of the vibration element; and a support member to fix the vibration element and the fixed member, wherein the support member passes through the vibration element and the fixed member, and elastically deforms in the gap.

Moreover, objects of the invention are achieved by a vibration actuator, including a hollow rod-shaped vibration element having an inner surface defined along an axis, the vibration element to generate a first or higher order torsional vibration about the axis and a first or higher order longitudinal vibration in the axial direction; a fixed member passing through the vibration element, wherein the fixed member is arranged to have a gap with respect to the vibration element; a relative motion member in compressive contact with an end surface of the vibration element; and a support member to connect the vibration element to the fixed member, including a first portion corresponding to a position of the gap and a second portion having a dimension greater than the first portion intersecting an axis of the support member, wherein the support member elastically deforms in the gap.

BRIEF DESCRIPTION OF THE DRAWINGS

These and other objects and advantages of the invention will become apparent and more readily appreciated from the following description of the preferred embodiments, taken in conjunction with the accompanying drawings of which:

FIGS. 6(A) to 6(H) are schematic views of elliptic motion in a driving surface of a vibration element which combines torsional vibration (T mode) and longitudinal vibration (L mode) according to a preferred embodiment of the present invention.

DETAILED DESCRIPTION OF THE PREFERRED EMBODIMENTS

Figure 1:
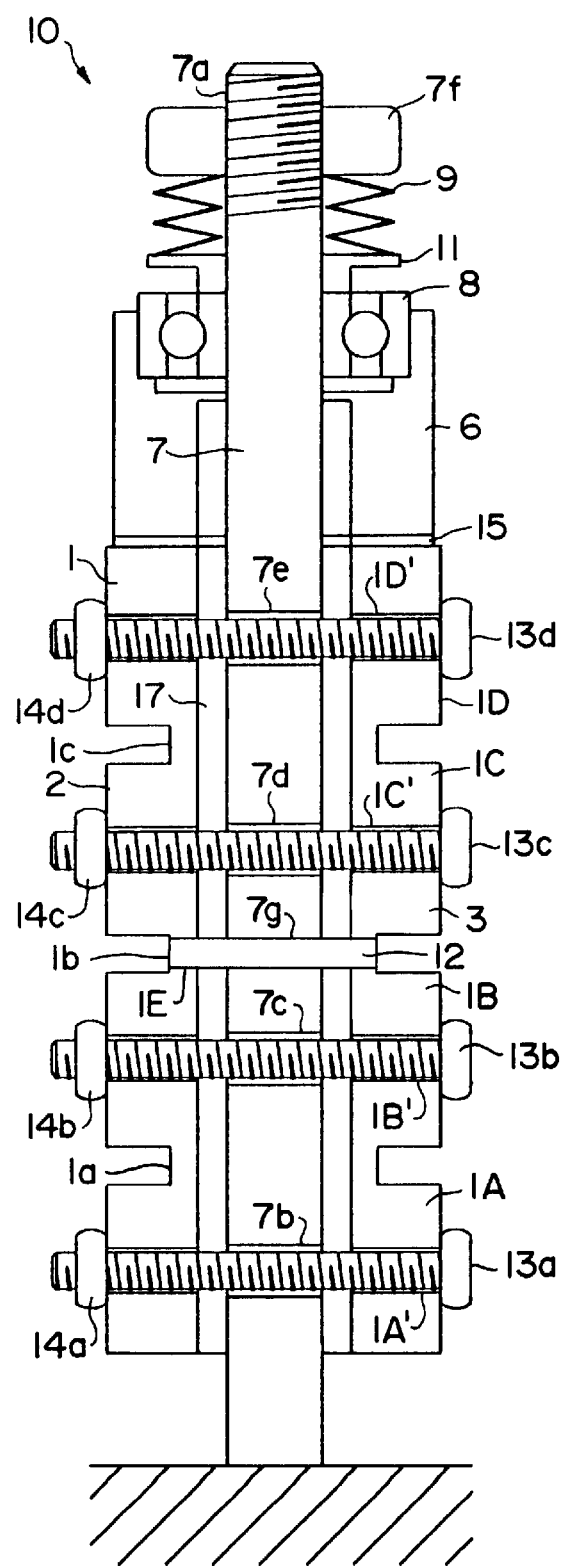
FIG. 1 is a cross sectional view of a vibration actuator according to a first preferred embodiment of the present invention.

Reference will now be made in detail to the preferred embodiments of the present invention, examples of which are illustrated in the accompanying drawings, wherein like reference numerals refer to like elements throughout.
First Preferred Embodiment Preferred embodiments of the present invention are described in detail hereinbelow, with reference to the accompanying drawings. Furthermore, in the description of each embodiment hereinafter, the present invention may be applied to an ultrasonic actuator which is an example of a vibration actuator using an ultrasonic vibration region.

FIG. 1 is a longitudinal cross sectional view of a vibration actuator according to a first preferred embodiment of the present invention. Vibration actuator 10 is equipped with a fixed shaft 7 and a moving element 6. The moving element 6 is a relative motion member and a vibration element supported by fixed shaft 7. The vibration element 1 and the moving element 6 are disposed in mutual compressive contact.

Fixed shaft 7 is a cylindrical member of circular shape in cross section and disposed in the axial direction. A threaded portion 7a is disposed at a first end of the fixed shaft 7. At a second end of the fixed shaft 7, a fixation surface of an on-board object instrument is fixed. Bolt holes 7b–7e for accommodating bolts 13a–13d are disposed transverse to a longitudinal direction of fixed shaft 7 and secured by nuts 14a–14d.

The vibration element 1 includes semicylindrical members 2, 3 which are elastic elements, first piezoelectric elements 4 which are electro-mechanical converting elements, and second piezoelectric elements 5 which are electro-mechanical converting elements, maintained in a state sandwiched between the semicylindrical members 2, 3.

The semicylindrical members 2, 3 are obtained through longitudinal division of a hollow cylindrical member, made from elastic material, along a plane which includes a central axis. As a material for the semicylindrical members 2, 3, stainless steel, invar, or aluminum alloy and the like metallic materials are preferred. However, semicylindrical members 2, 3 may be constituted by other elastic materials, for example, plastics.

In the external circumferential surface of vibration element 1, at positions which become respective vibration nodes of the torsional vibration and longitudinal vibrations, described hereinbelow, small diameter portions 1a, 1b and 1c, which are constricted, are formed by grooves. Smaller diameter portion 1b is formed at an approximate center portion in a vibration element axial direction. On the other hand, small diameter portions 1a, 1c are positioned symmetrically of both ends in the axial direction of the vibration element in relation to the small diameter portion 1b. Namely, they are formed at nodal positions of the torsional vibration.

Large-diameter portions 1A–1D are formed in the vibration element 1 and partitioned by the small diameter portions 1a–1c. In forming small diameter portions 1a–1c, at a flat portion which includes the central shaft with respect to the vibration element base material, before longitudinally dividing into two, a cutting process to form the same diameter portions is simple and accurate.

Furthermore, in the present embodiment, the small diameter portions 1a, 1b and 1c are formed as constricted grooves. However, there is no limitation of the vibration actuators according to the present invention to such a configuration. For example, the cross sectional area perpendicular to an axial direction of vibration element 1 may be formed such that it changes continuously in the axial direction.

Bolt holes 1A'–1D' are formed in a direction at right angles to the central axis of vibration element 1. Bolt holes 1A' and 1D' are located in an approximate central portion in the vibration element axial direction of each respective large diameter portion 1A–1D.

Fixed shaft 7 is inserted in a central portion in a state sandwiching piezoelectric elements 4, 5, in the plane of division of semicylindrical members 2, 3. Bolt holes 7b–7e disposed in fixed shaft 7 are positioned facing the bolt holes 1A'–1D' which have been disposed in the vibration element 1. Bolts 13a–13d are then inserted into bolt holes 7b–7e and 1A'–1D', and are tightened with nuts 14a–14d. The semi-cylindrical members 2, 3 are tightened and fixed in this manner.

Furthermore, by coating an adhesive between semicylindrical members 2, 3 and piezoelectric elements 4, 5, tightening of bolts 13a–13d and nuts 14a–14d can provide a more secure fixation.

A gap 17 is disposed between the vibration element 1 and fixed shaft 7 and, by suppressing contact of the vibration element 1 and the fixed shaft 7, is such that the fixed shaft 7 does not impede the generation of torsional vibrations and longitudinal vibrations in vibration element 1. Moreover, gaps which are also formed between the fixed shaft 7 and the bolts 13a–13d prevent the bolts 13a–13d from coming into contact with the fixed shaft 7.

A pin hole 1E is formed in an approximate central portion of an axial direction of vibration element 1, namely, in a nodal position of the longitudinal vibration. On the other hand, a pin hole 7g of the same diameter is formed in the approximately central portion of the length direction of the fixed shaft 7. Pin hole 7g formed in the fixed shaft 7 and pin hole 1E formed in the vibration element 1 are in facing positions, and pin 12 is inserted into these pin holes 7g and 1E and thereby fixes them.

Furthermore, in order to prevent positional displacement of inserted pin 12, pin 12 may adhere to pin hole 7g and pin hole 1E. In this manner, the fixation of the vibration element 1 and fixed shaft 7 is performed by pins, which are not bolts.

By way of the first preferred embodiment, pin 12 is freely and elastically deformable in an exposed portion of the gap 17 between the fixed shaft 7 and the vibration element 1. Accordingly, displacement of the pin hole position of the vibration element 1 generated by one or both of the torsional vibration and longitudinal vibrations generated in the vibration element 1 can be tolerated. Because the torsional vibration and longitudinal vibrations are not strongly restricted, there is no disappearance of the torsional vibration and the longitudinal vibration, and support losses due to the fixed shaft 7 are reduced.

A material for pin 12 may be an elastic material. For example, pin 12 may be made from stainless steel, aluminum alloy, phosphor bronze and the like metallic material, or a plastic and the like elastic material.

Furthermore, by supporting by only one pin, there are cases in which rotation around the pin axis or displacement in the axial direction of the pin cannot be eliminated. Consequently, in order to restrict both rotation around the pin axis and displacement in the pin axial direction, between fixed shaft 7 and vibration element 1, it is desirable to arrange, for example, installation of one or more collar member(s) in an inner surface of an upper portion and a lower portion of vibration element 1. Resin materials having a low coefficient of friction such as polyphenylenesulfide or polytetrafluoroethylene, shaped into an annular form, may be used which do not obstruct the vibration of the vibration element 1.

Here, when pin 12 is considered as a spring element, the vibrational system of the pin 12 and the vibration element 1 includes a mass, and a moment of inertia can be substituted. In this case, a resonant frequency relating to the axial direction around the axis of the vibration element 1, the configuration, material, and the like of the pin 12 are preferably set to be sufficiently low in comparison with the driving frequency. By setting in this manner, the vibrations generated in the vibration element 1 can be cut off by pin 12 and can prevent leakage of the vibrational energy propagated by pin 12. In this manner, the vibration actuator can be designed for increased performance.

Furthermore, in the present embodiment, the pin 12 is located in the nodal position of the longitudinal vibration, and the support losses with respect to the longitudinal vibration are greatly reduced. Accordingly, even if a compressive force with which moving element 6 is in compressive contact with the vibration element 1 is caused to increase, there is little obstruction of a clutch action between the vibration element and the moving element 6. Accordingly, in the case of the first preferred embodiment, by causing the compressive force to increase, the torque which the vibration actuator 10 generates is caused to increase, and it is possible to provide a high torque type of vibration actuator 10.

In FIG. 1, the moving element 6, which is a thick disc-shaped relative motion member, is rotatably supported, via a bearing 8 disposed in its central portion, on fixed shaft 7. The material of the moving element 6 is desirably aluminum alloy, stainless steel, or the like metallic material, or a plastic.

On a sliding surface of the moving element 6 with the vibration element 1, a sliding material 15 of polyphenylenesulfide or polytetrafluoroethylene is adhered, and thereby reduces a sliding resistance of moving element 6 and vibration element 1. In the present embodiment, the sliding material 15 is adhered on a moving element 6 side, but it may be adhered to the surface of the vibration element 1 which comes into contact with the moving element 6.

Moreover, a compression member 11 and a spring 9 are assembled on a fixed shaft 7, in this order, on the surface of the moving element 6 opposite to the sliding surface, and by tightening an adapted nut 7f, adapted to a threaded portion 7a on fixed shaft 7, the moving element 6 compresses with a suitable compressive force toward vibration element 1. The compressive force of spring 9 is changed by changing a position of adapted nut 7f relative to threaded portion 7a.

Figures 2A, 2B:
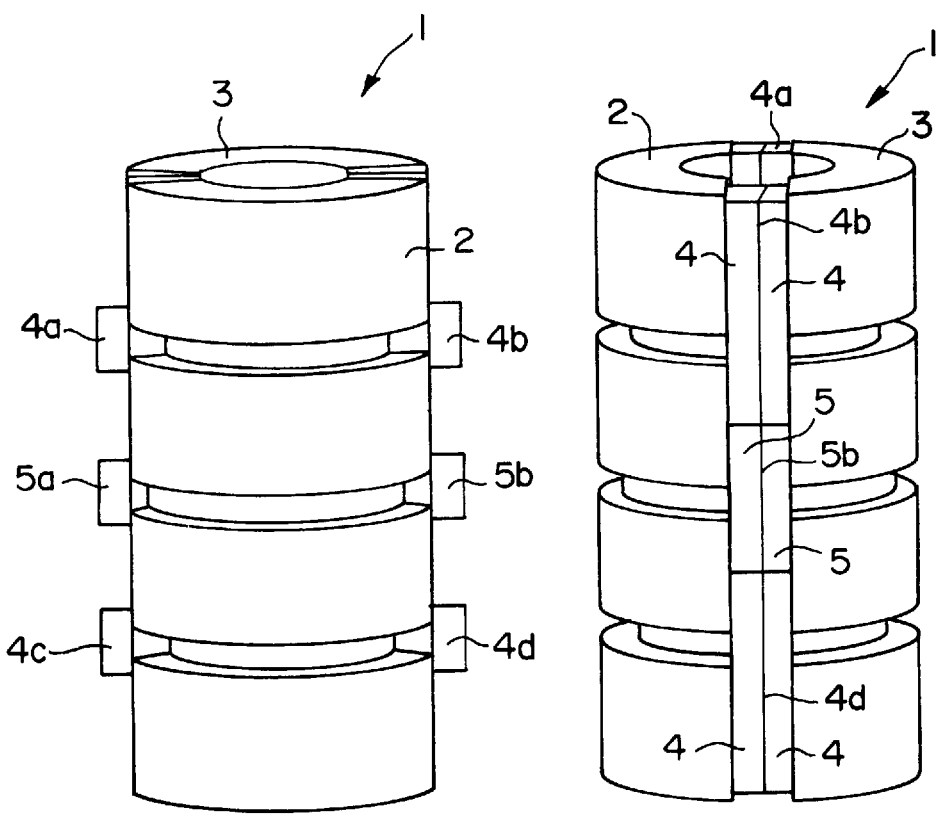
FIG. 2(A) is an elevated perspective view of a vibration element of the vibration actuator of FIG. 1.
FIG. 2(B) is a rotated, elevated perspective view of the vibration actuator of FIG. 2(A).

FIG. 2(A) and FIG. 2(B) are elevated perspective views of a vibration element used in the vibration actuator 10 according to the first preferred embodiment of the present invention. Furthermore, in FIG. 2(A) and FIG. 2(B), bolts 1A'–1D' for tightening the semicylindrical members 2, 3 are omitted.

As illustrated in FIG. 2(A) and FIG. 2(B), a total of twelve planar piezoelectric elements 4, 5 are maintained, sandwiched between the semicylindrical members 2, 3 which constitute vibration element 1.

Piezoelectric elements 4, which are first electro-mechanical converting elements, are piezoelectric elements used for torsional vibration. On the other hand, piezoelectric elements 5, which are electro-mechanical converting elements, are used for longitudinal vibration. Each piezoelectric element is arranged as a double laminate. There are four piezoelectric elements 4 close to an upper end of semicylindrical members 2, 3, and four close to a lower end, for a total of eight. On the other hand, four piezoelectric elements 5 are arranged close to a center.

Electrodes 4a, 4b, 4c and 4d are disposed between the piezoelectric elements 4. Electrodes 5a, 5b are disposed between the electrodes 5. The electrodes 4a–4d, and 5a, 5b are formed of stainless steel, copper, phosphor bronze, or like sheet metal, and are fixed by adhesion to piezoelectric elements 4, 5, or are fixed by tightening nuts 14a–14d onto bolts 13a–13d. Moreover, semicylindrical members 2, 3 are connected to ground.

Figure 3:
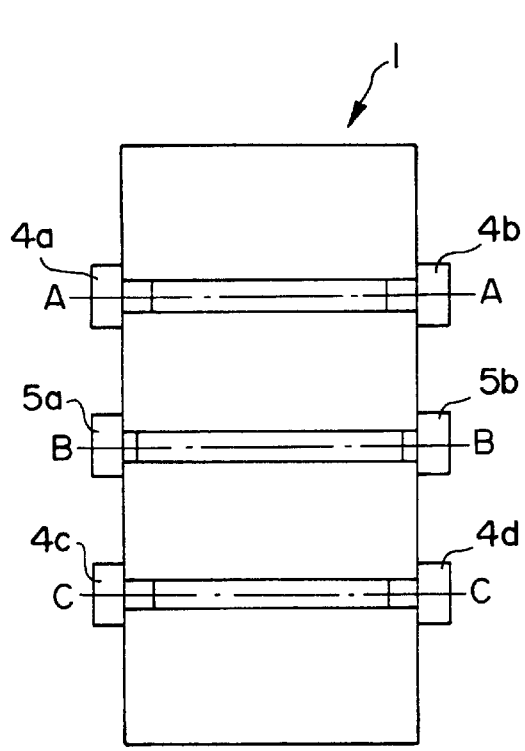
FIG. 3 is a side view of a vibration element of the vibration actuator of FIG. 1.
Figure 3A:
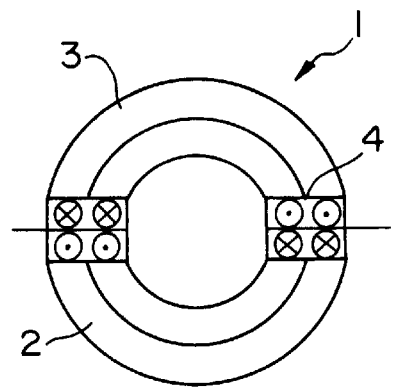
FIG. 3(A) is a sectional view taken along line A—A of FIG. 3.
Figure 3B:
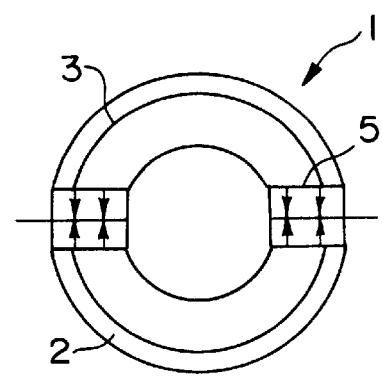
FIG. 3(B) is a sectional view taken along line B—B of FIG. 3.
Figure 3C:
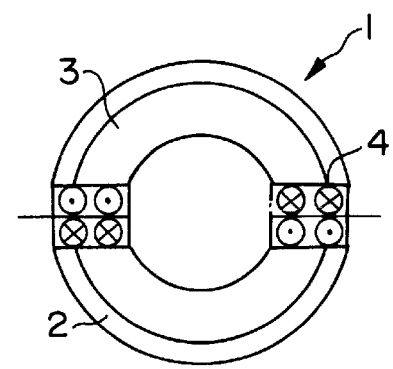
FIG. 3(C) is a sectional view taken along line C—C of FIG. 3.

FIG. 3 is a side view of a vibration element 1 used in an vibration actuator 10 according to the first preferred embodiment of the present invention. FIGS. 3(A)–3(C) are cross sectional views respectively taken along lines A—A, B—B and C—C, and illustrate the disposition of piezoelectric elements 4, 5 of the vibration actuator 10. Furthermore, similarly to FIG. 2, bolts 1A'–1D' used for tightening are omitted in FIG. 3. FIGS. 3(A)–(C) illustrate the respective directions of polarization of the piezoelectric elements 4 used for torsional vibration and the piezoelectric elements 5 used for longitudinal vibration.

FIGS. 4(A), 4(B), 5(A), and 5(B) are schematic diagrams which illustrate a direction of polarization and electrode polarization, and a deformation when a voltage is impressed, of the piezoelectric elements 4 and of the piezoelectric elements 5, used in the vibration actuator 10.

Figure 4A:
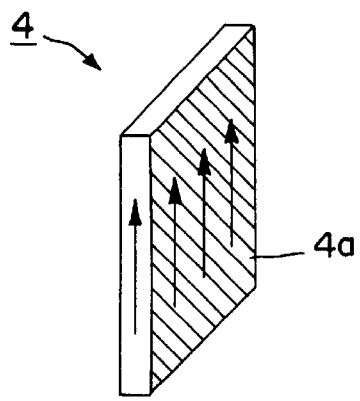
FIG. 4(A) is a schematic view of a piezoelectric element for torsional vibration having an associated direction of polarization and electrode disposition according to the first preferred embodiment of the present invention.
Figure 4B:
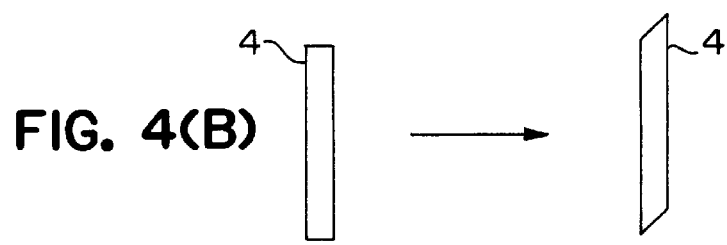
FIG. 4(B) is a schematic view of a deformation in the piezoelectric element of FIG. 4(A) in response to an application of voltage.

Piezoelectric elements 4 used for torsional vibration are polarized, as illustrated in FIG. 4(A), in a length direction of the flat plates, thereby impressing a voltage using the electrode 4a illustrated in FIG. 4(A) when an electric field is generated in the thickness direction of the plate. By utilizing a shearing deformation, as illustrated in FIG. 4(B), the vibration element 1 is caused to vibrate torsionally.

Figure 5A:
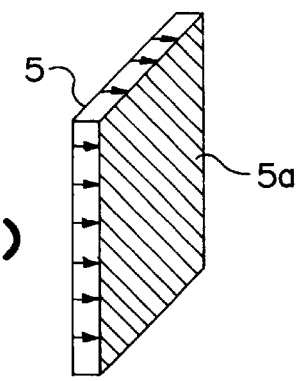
FIG. 5(A) is a schematic view of a piezoelectric element for longitudinal vibration having an associated direction of polarization and electrode disposition according to the first preferred embodiment of the present invention.
Figure 5B:
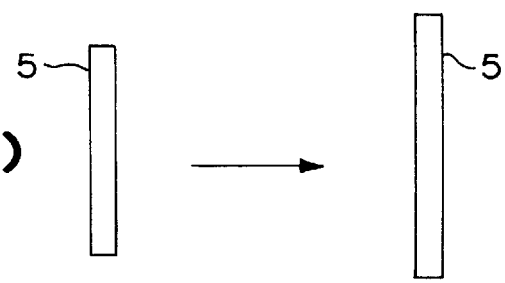
FIG. 5(B) is a schematic view of a deformation in the piezoelectric element of FIG. 5(A) in response to an application of voltage.

On the other hand, piezoelectric elements 5 used for longitudinal vibration are polarized, as illustrated in FIG. 5(A), in a thickness direction of the flat plates. By impressing a voltage using the electrode 5a illustrated in FIG. 5(A), when an electric field is generated in the thickness direction of the plate, a stretching deformation is induced and vibration element 1 is caused to vibrate longitudinally.

A description is next given of a respective timing of the generation of torsional vibrations and longitudinal vibrations in vibration element 1. FIGS. 6(A) to 6(H) schematically illustrate a time course of an elliptical motion generated in a driving surface of vibration element 1, combining the torsional vibration (T mode) and longitudinal vibration (L mode) which are generated in this manner in vibration element 1.

As illustrated in FIGS. 6(A)–(H), when a phase difference between the torsional vibration and the longitudinal vibration is $(1/4)\lambda$ ($\lambda$=period), namely displaced by $\pi/2$, elliptical motion is generated at a point on the driving surface.

When the driving frequency is denoted by f, the angular frequency is then $\omega(=2\pi f)$, at a time point of time when $t=(6/4)\cdot(\pi/\omega)$. The torsional displacement is large and to the left-hand side and the longitudinal displacement is zero.

From this state, through the time points $t=(7/4)\cdot(\pi/\omega)-0-(2/4)\cdot(\pi/\omega)$, the vibration displaces from a left-hand side maximum to a right-hand side maximum, and on the other hand the longitudinal vibration displaces from zero to an upper side maximum, and again returns to zero. Accordingly, while the driving surface of the vibration element is pressing on moving element 6 (not illustrated in the FIGS. 6(A)–(H), a rotation in a right-hand direction is induced and moving element 6 is driven.

Next, through the time points $t=(2/4)\cdot(\pi/\omega)-(6/4)\cdot(\pi/\omega)$, the torsional vibration displaces from a maximum on the right-hand side to a maximum on the left-hand side, and on the other hand the longitudinal vibration displaces from zero to a lower side maximum, and again returns to zero. At this time, the moving element 6 is pressed by way of compression member 11. However, in order to reduce the fundamental frequency of the compression member 11 to markedly lower than the vibration actuator frequency region, moving element 6 does not follow the contraction of the vibration element 1. Accordingly, vibration element 1 and moving element 6 remain separated.

Figure 7:
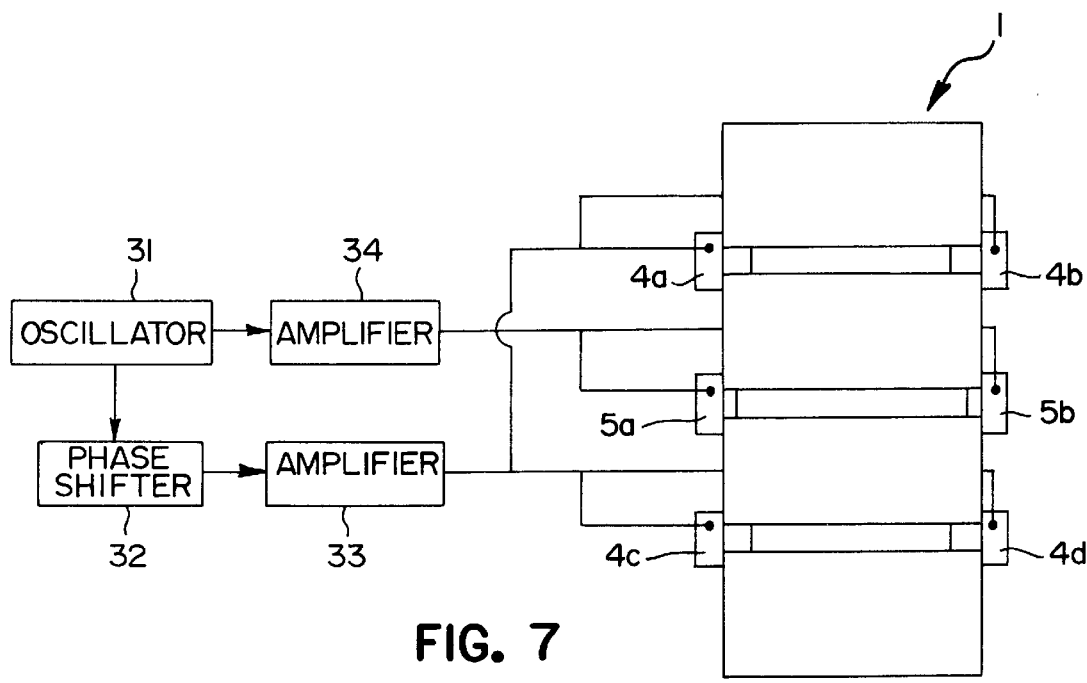
FIG. 7 is a block diagram of a driving circuit for a vibration actuator according to the first preferred embodiment of the present invention.

FIG. 7 is a block diagram illustrating a driving circuit of a vibration actuator 10 according to the first preferred embodiment of the present invention.

Oscillator 31, which is a driving signal generating device, generates a driving signal of a predetermined frequency. Oscillator 31 has output branches, with one side having a phase advance of 90°, or phase delay of 90°, connected via a phase shifter 32 to an amplifier 33. On the other side, oscillator 31 is directly connected to amplifier 34. Each amplifier 33, 34 is connected to a respective electrode 4a–4d, 5a and 5b, maintained on vibration element 1.

Figures 8A, 8B:
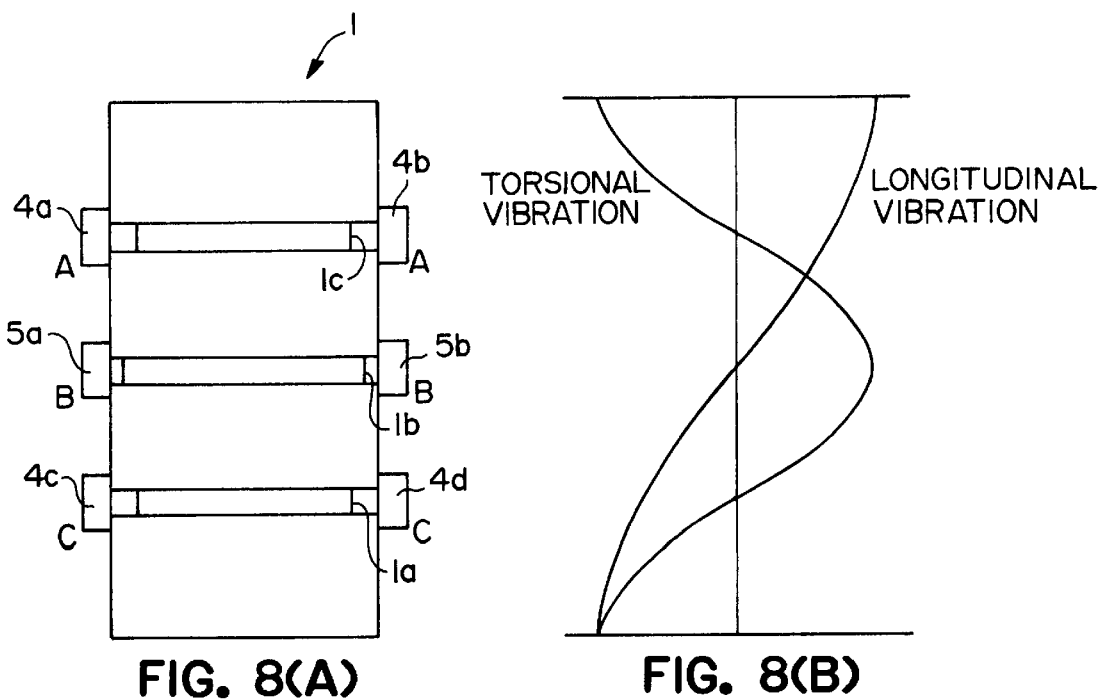
FIG. 8(A) is a side view of a vibration element for a vibration actuator according to the first preferred embodiment of the present invention.
FIG. 8(B) is a graph illustrating longitudinal and torsional vibration modes which are generated in the vibration element of FIG. 8(A).

Furthermore, by selecting an optimum value, and by adjusting a phase difference of phase shifter 32, the torque, rpm and efficiency of the vibration actuator 10 can be caused to increase. FIG. 8(A) is side view of a vibration element for a vibration actuator according to a first preferred embodiment of the present invention. FIG. 8(B) is a graph illustrating respective longitudinal and torsional vibration modes which are generated in the vibration element of the vibration actuator of FIG. 8(A).

According to a preferred embodiment of the present invention, generation of a first order longitudinal vibration and a second order torsional vibration is caused in vibration element 1, and these vibrations are utilized. For this purpose, in order to drive with good efficiency, a resonant frequency of the torsional vibration and the resonant frequency of the longitudinal vibration approximately coincide. Moreover, rotary displacement amplitude and longitudinal displacement amplitude are caused to increase. In order to cause this approximate coincidence, in the present embodiment, constrictions, in the form of small diameter portions 1a–1c of grooves in the vibration element 1 are disposed.

Small diameter portions 1a–1c are respectively disposed in a total of three places as follows: in an approximate center of a length direction of vibration element 1, which is a nodal position of a longitudinal vibration, and at two places close to both ends of a length direction of vibration element 1, which are nodal positions of the torsional vibration.

For example, the resonant frequency of the first order longitudinal vibration can decrease by way of making a depth of small diameter portion 1b (which is disposed at the node of the longitudinal vibration) deeper, or by making its width wider, in order to reduce the rigidity of the first order longitudinal vibration of vibration element 1.

At this time, because small diameter portion 1b is positioned at an antinode of the second order torsional vibration, small diameter portion 16 does not have much effect on the resonant frequency of the second order torsional vibration. Similarly, by changing a shape of the small diameter portions 1a, 1c which are disposed at nodes of the second order torsional vibration, the resonant frequency of the second order torsional vibration can be caused to change.

In this manner, because the resonant frequency of the longitudinal vibration can be caused to change by changing the shape of the small diameter portion 1b, the relative frequencies of the longitudinal vibration and of the torsional vibration can be caused to approximately coincide, and it becomes possible to obtain a large longitudinal vibration amplitude and torsional vibration amplitude by way of a small input.

If the amplitude of the first order longitudinal vibration is increased, because it is possible to increase the compressive force of moving element 6, the torque of the vibration actuator 10 can be increased. Moreover, if the amplitude of the torsional vibration is increased, the rpm of moving element 6 increases. As a result, it becomes possible to cause increases in various properties such as torque, rpm, and driving efficiency, etc., of vibration actuator 10.

Furthermore, in order to improve the performance of the vibration actuator 10, it is possible to find optimum conditions by optimally changing the material and configuration of the vibration element 1, the material and configuration of the moving element 6, and the compressive force between the vibration element 1 and the moving element 6.

In this manner, in the present embodiment, because laminar piezoelectric elements 4, 5 are used for the generation of torsional vibration of the vibration actuator 10, improving the configurational precision of the piezoelectric elements 4, 5, the vibration of the piezoelectric elements 4, 5 becomes reliably propagated to vibration element 1. Accordingly, the performance of the vibration actuator 10 is improved.

Moreover, because the piezoelectric elements 4 used for the generation of torsional vibration are thin, the necessary impressed voltage in order to obtain a predetermined electric field can be reduced, and the driving efficiency of the vibration actuator can be improved.

Moreover, in the present embodiment, by way of the small diameter portions 1a–1c disposed in the vibration element 1, the rigidity related to the longitudinal vibration and the rigidity related to the torsional vibration of the vibration element 1 are reduced, and the vibrational displacements are increased. Accordingly, a high torque and a high rpm of vibration actuator 10 become possible.

Moreover, the resonant frequencies of the longitudinal vibration and of the torsional vibration become reduced by way of a reduction of the rigidity related to the longitudinal vibration and the rigidity related to the torsional vibration of vibration element 1, and it is possible to cause an improvement of the efficiency of the vibration actuator 10.

Furthermore, in the present embodiment, because small diameter portions 1a–1c disposed in the vibration element 1 are respectively disposed independently in nodes of the longitudinal vibration and nodes of the torsional vibration, the respective resonant frequencies of the longitudinal vibration and torsional vibration can be caused to coincide by adjusting the external diameters of the respective small diameter portions 1a–1c.

In this manner, by way of the small diameter portions 1a–1c disposed in the vibration element 1, the respective resonant frequencies of the longitudinal vibration and torsional vibration can be caused to coincide. Furthermore, because it becomes possible to cause the amplitude of the longitudinal vibration and the amplitude of the torsional vibration to increase, it becomes possible to realize a vibration actuator 10 having high torque and high rpm.

Moreover, it was a problem in the conventional vibration actuators, that heating and temperature rises occurred due to inductive losses during driving of the piezoelectric elements and elastic member, and internal friction due to vibration, etc. Thus, the resonant characteristics of the vibration element became changed. In accordance with the preferred embodiment of the present invention, the surface area of vibration element 1 is enlarged by the provision of the small diameter portions 1a–1c, and because the heat radiating efficiency is improved, it becomes possible to suppress a rise in temperature. The small diameter portions 1a–1c are all the more effective when disposed in a vicinity of the nodal portions or piezoelectric elements 4,5 which tend to generate heat during driving.

Furthermore, in the vibration actuator 10, fine adjustment (i.e. tuning) of the respective resonant frequencies of the longitudinal vibration and torsional vibration can be easily performed after assembly.

Namely, the vibration actuator 10 is designed such that the small diameter portions 1a–1c are disposed in positions which cause the respective resonant frequencies of the longitudinal vibration and torsional vibration to coincide. However, due to the effect of processing tolerances and the like during manufacture, cases are considered in which the respective resonant frequencies of the longitudinal vibration and the torsional vibration do not coincide. Examples include the case where the bolts 13a–13d are replaced by other bolts 13a'–13d' which differ in head length or differ in material, namely mass. It is therefore desirable to replace, in particular, the inside bolts 13b and 13c, from the standpoint of maintaining the strength of the vibration element 1. A second example is the inclusion of washers for the bolts 13a–13d. A third example is changing not only the external diameter of the small diameter portions of the vibration element 1, but also changing, by a grinding process and the like, the large diameter portions 1A–1D of the vibration element 1. Furthermore, the length in the axial direction of the vibration element 1 may change.

Thus, because the rate of change of the first order longitudinal vibration and the rate of change of the second order torsional vibration differ, by adjusting the resonant frequencies of the longitudinal vibration and the torsional vibration, they can be caused to be close to or to coincide. Furthermore, it is desirable, taking into account the number of processes of tuning operations, to set the amount of adjustment of the resonant frequency by way of such tuning to be small, for example 10 Hz or less.

Second Mode of Embodiment

Figure 9:
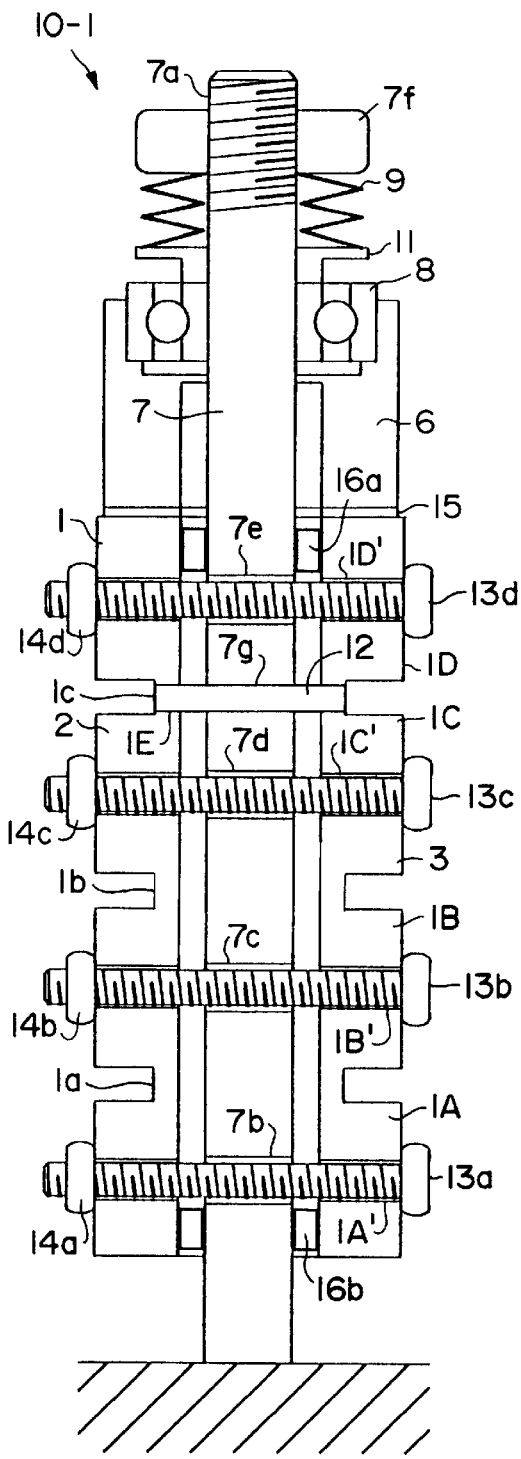
FIG. 9 is a longitudinal cross sectional view of a vibration actuator according to a second preferred embodiment of the present invention.

FIG. 9 is a cross sectional view illustrating a vibration actuator 10-1 according to a second preferred of embodiment of the present invention. Furthermore, the descriptions of each mode of embodiment hereinafter will be performed in terms of the differences from the first mode of embodiment.

Because the vibration actuator 10-1 of this second embodiment differs from the vibration actuator 10 of the first embodiment only in the position at which pin 12 is located, only portions which are different are described here, and the portions in common are denoted by the same symbols in the drawings. Duplicate descriptions are omitted.

In the second preferred embodiment, pin 12 is located in a nodal position of the upper side in the two nodal positions of the torsional vibration generated in the vibration element 1. This nodal position is a position at which the small diameter portion 1c is formed.

In this manner, in the second preferred embodiment, because pin 12 is located in a nodal position of the torsional vibration where the small diameter portion 1c is formed, the vibration element 1 can be fixed and supported by the fixed shaft 7 while hardly restricting the torsional vibration generated in the vibration element 1. The position at which the pin 12 is located also becomes close to an antinode position of the longitudinal vibration, but the vibrational attenuation with respect to the longitudinal vibration is permitted, due to the elastic deformation of the pin 12.

Accordingly, by way of the vibration actuator 10-1, it becomes possible to maintain a large amplitude of the torsional vibration generated in the vibration element 1. Moreover, because vibration element 1 is fixed and supported to fixed shaft 7 by pin 12, the reduction of the amplitude of the longitudinal vibration is small. Accordingly, the rpm of the vibration actuator 10-1 can be increased, and can provide a high rotational speed type of vibration actuator 10-1.

Furthermore, in the second preferred embodiment and with regard to the support position of the vibration element 1, there is a risk of the vibration element 1 rotating with respect to the fixed shaft 7 as a rotation center, accompanying driving because the position is displaced from the center portion in the length direction of vibration actuator 1. Consequently, in the present embodiment, annular collar members 16a and 16b are mounted near a top end and near a bottom end of an inner surface of vibration element 1. These collar members 16a and 16b may be the same as those used in the prior art article and it is not necessary to restrict them to a particular type.

Third Mode of Embodiment

Figure 10:
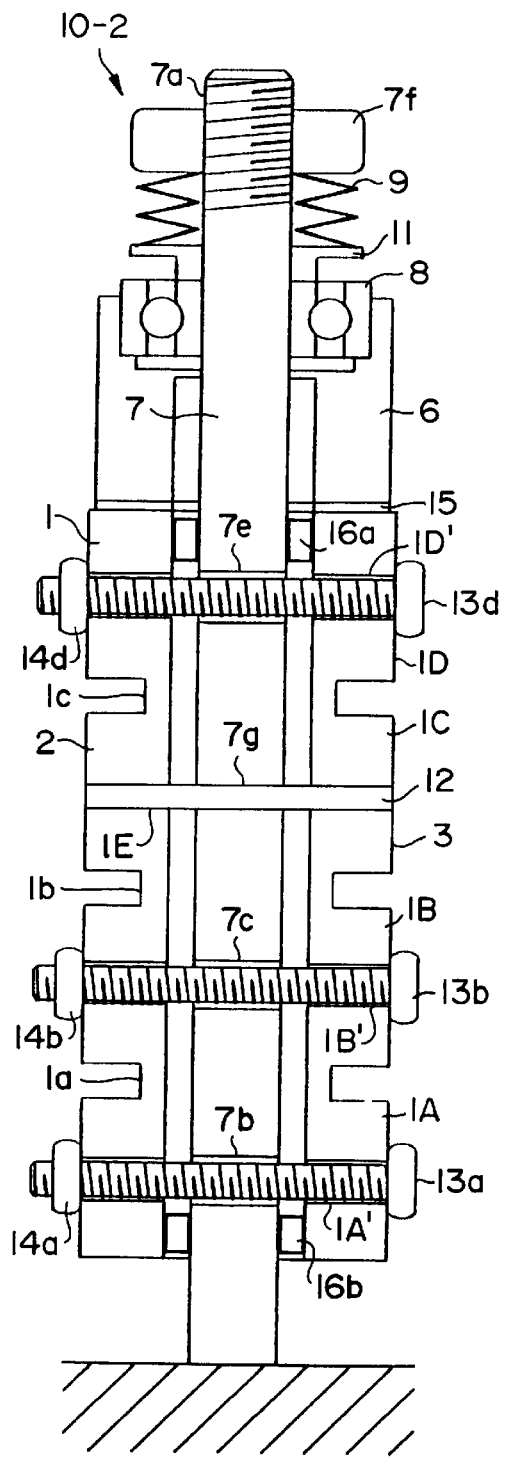
FIG. 10 is a longitudinal cross sectional view of a vibration actuator according to a third preferred embodiment of the present invention.

FIG. 10 is a cross sectional view of the vibration actuator 10-2 according to a third preferred embodiment of the present invention.

In the third preferred embodiment, the pin 12 is substituted for the bolt 13c and nut 14c of the first preferred embodiment. This location position of pin 12 corresponds to a position between a node of the torsional vibration and a node of the longitudinal vibration which are generated in vibration element 1.

Accordingly, the respective decreases in the vibrational amplitudes are small because pin 12 is located in a close position from the respective nodal positions of the torsional vibration and the longitudinal vibration. Accordingly, an vibration actuator 10-2 is provided with an excellent balance of torque and rpm.

Fourth Mode of Embodiment

Figure 11:
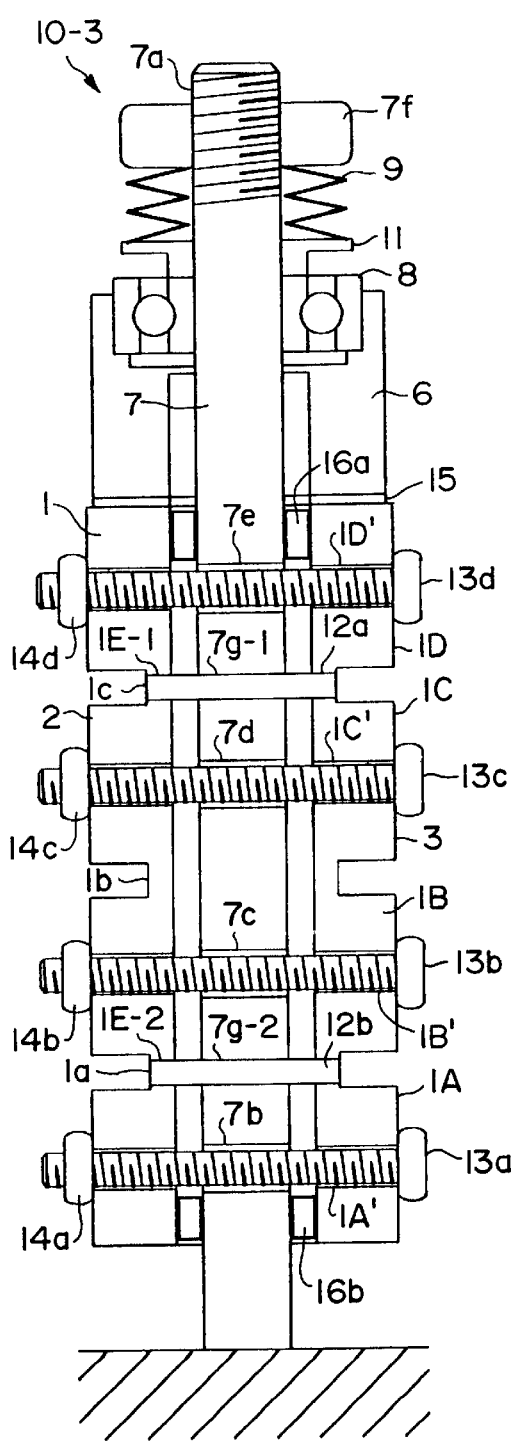
FIG. 11 is a longitudinal cross sectional view of a vibration actuator according to a fourth preferred embodiment of the present invention.

FIG. 11 is a cross sectional view of a vibration actuator 10-3 according to a fourth preferred embodiment of the present invention.

In this fourth preferred embodiment, the vibration element 1 is supported by way of plural pins 12a, 12b, totaling two in number, by way of two nodal positions, upper and lower, of the torsional vibration. An effect similar to that of the first embodiment is thereby obtained.

Moreover, through the pins 12a, 12b which support the vibration element 1, the vibration element 1 can no longer rotate with respect to the fixed shaft 7, with the pin location position as a center. Accordingly, the driving characteristics of vibration actuator 10-3 can be improved, even without mounting collar members 16a, 16b and the like between vibration element 1 and fixed shaft 7. Moreover, FIG. 11 illustrates a state in which collar members 16a, 16b are mounted.

Fifth Mode of Embodiment

Figure 12:
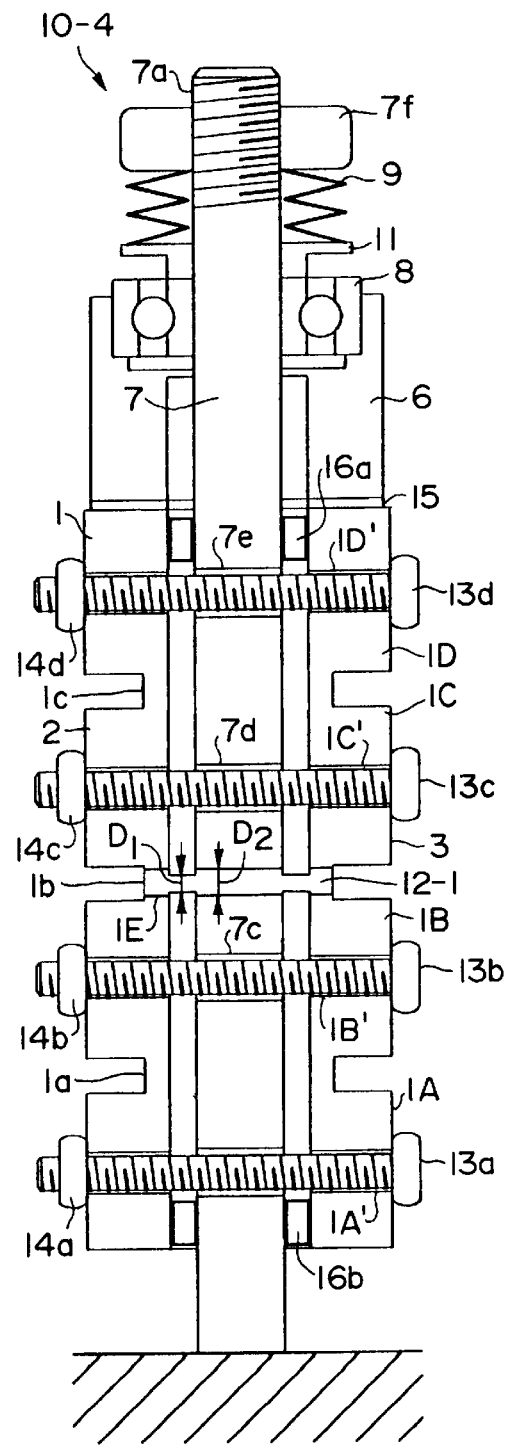
FIG. 12 is a longitudinal cross sectional view of a vibration actuator according to a fifth preferred embodiment of the present invention.
Figure 13:
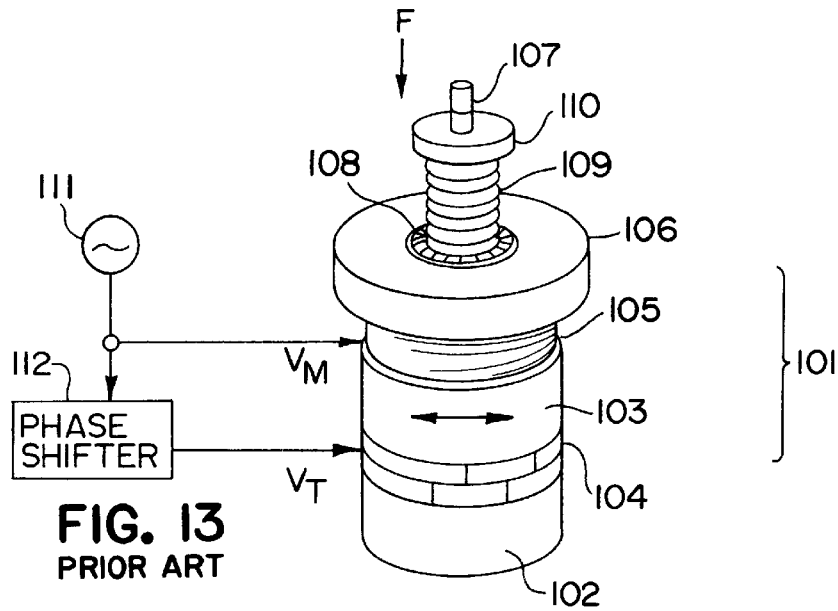
FIG. 13 (PRIOR ART) is an elevated perspective view of a conventional a torsional-longitudinal vibration type of vibration actuator.
Figure 14:
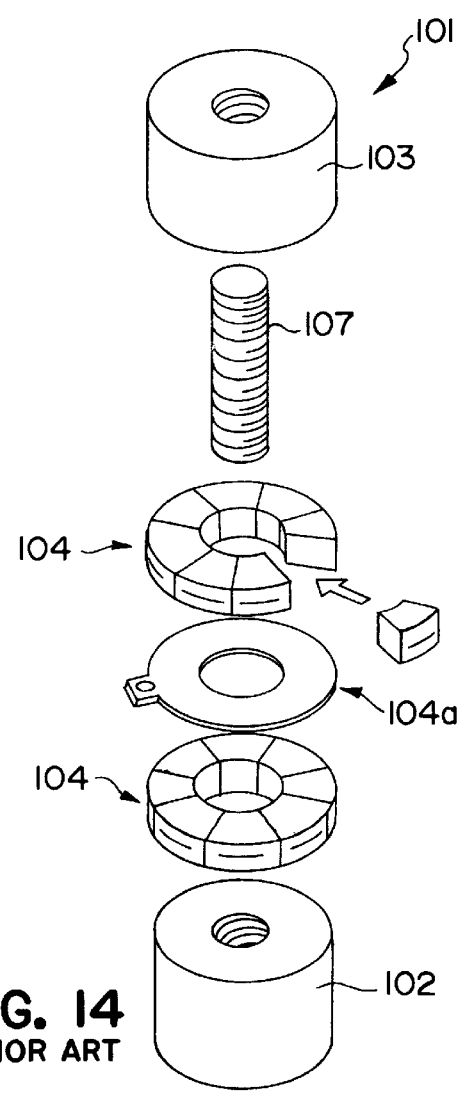
FIG. 14 (PRIOR ART) is an exploded perspective view of a fixed element of a conventional vibration actuator.
Figure 15:
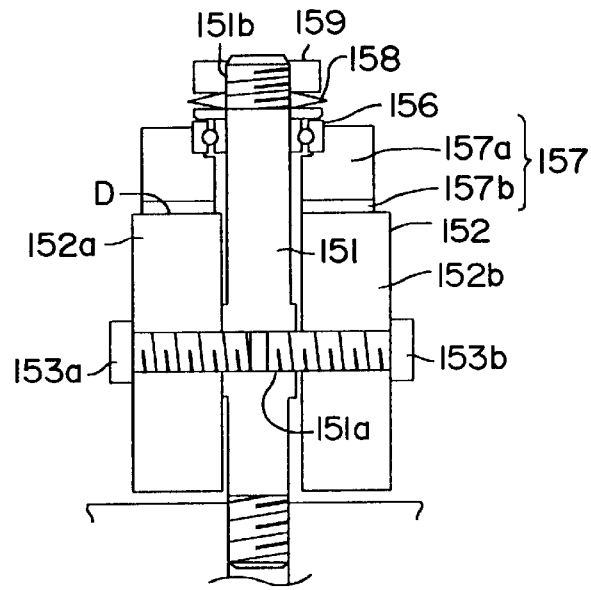
FIG. 15 (PRIOR ART) is a cross sectional view of a conventional vibration actuator using degenerate modes of different form.
Figure 16:
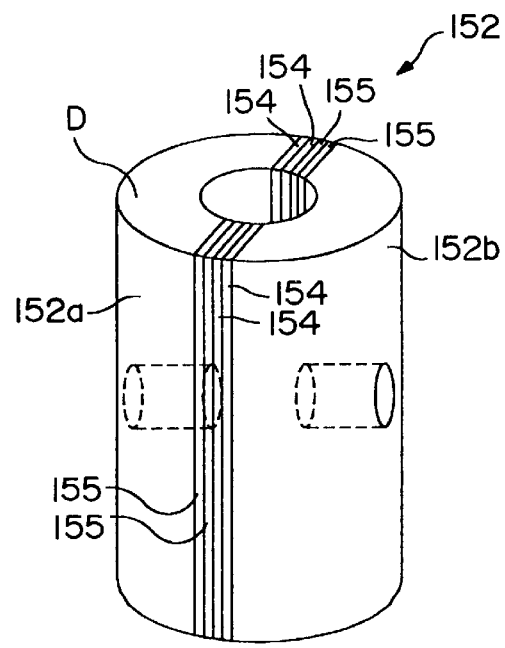
FIG. 16 (PRIOR ART) is an elevated perspective view of a conventional vibration element extracted from a vibration actuator.

FIG. 12 is a cross sectional view of a vibration actuator 10-4 according to a fifth preferred embodiment of the present invention.

In this fifth preferred embodiment, in contrast to vibration actuator 10 of the first preferred embodiment, a stepped pin 12-1 is used. Stepped pin 12-1 formed with a diameter $D_1$ of the exposed portion in the gap between fixed shaft 7 and the vibration element 1 made thinner, in step form, than diameter $D_2$ of other than the exposed portion.

In this preferred embodiment including the use of stepped pin 12-1, the stepped pin 12-1 becomes easily deformed in the exposed portion and the vibration restriction of the vibration element 1 can be reduced.

Moreover, the diameter $D_2$ of other than the exposed portion is constant. This provides for a number of stepped pins 12-1 with the diameter $D_1$ of the exposed portions suitably changed. By using a series of the exposed portions to support vibration element 1, it becomes possible to select a diameter $D_1$ of the stepped pin 12-1 which is optimum for driving. At this time, it becomes unnecessary to change the insertion hole diameter of the vibration element 1 and the fixed shaft 7.

Modified Embodiments

In each of the preferred embodiments described hereinabove, an vibration actuator having a general range of vibration range has been described. However, the vibration actuators according to embodiments of the present invention may equally be applied to ultrasonic actuators or other regions of vibration.

Moreover, in each preferred embodiment, the vibration element has been constituted using two semicylindrical members. However, the vibration actuators according to embodiments of the present invention are not so limited, and vibration elements may be constituted using plural, three or more, elastic elements.

Moreover, in each preferred embodiment, examples have been given in which a first order longitudinal vibration and a second order torsional vibration are generated in vibration element 1. However, vibration actuators according to embodiments of the present invention are not limited to such modes, and is equally well applied to a case in which a first order longitudinal vibration and a first order torsional vibration as generated.

Moreover, the external form of the vibration element is approximately cylindrical in each preferred embodiment. However, the vibration actuators according to embodiments of the present invention are not so limited, and may be square, columnar, and the like or hollow rods.

Moreover, in each preferred embodiment, piezoelectric elements have been used as the electro-mechanical converting elements. However, the vibration actuators according to embodiments of the present invention are not so limited, and may generally be other forms which convert electrical energy into mechanical energy. For example, they can be exemplified by electrostrictive elements.

Moreover, parallel pins have been used as support members in each preferred embodiment. However, the vibration actuators according to embodiments the present invention are not so limited. For example, spring pins which can freely expand and contract in space can be substituted.

Furthermore, in each preferred embodiment, parallel pins as support members are located in positions which coincide with nodal positions of the longitudinal vibration and torsional vibration generated in the vibration element. However, the vibration actuators according to embodiments of the present invention are not so limited and may be in the vicinity of nodal positions.

Although a few preferred embodiments of the present invention have been illustrated and described, it will be appreciated by those skilled in the art that changes may be made in these embodiments without departing from the principles and spirit of the invention, the scope of which is defined in the claims and their equivalents.

What is claimed is:

1. A vibration actuator, comprising:

a hollow rod-shaped vibration element having an inner surface defined along an axis, said vibration element generating torsional vibration around the axis, having at least one node, and longitudinal vibration in the axial direction, having at least one node;

a fixed member passing through said vibration element, wherein said fixed member is arranged to have a gap with respect to said vibration element;

a relative motion member in compressive contact with an end surface of said vibration element; and a support member to connect said vibration element to said fixed member, wherein said support member passes through said vibration element and said fixed member, and elastically deforms in the gap.

2. The vibration actuator according to claim 1, wherein said support member includes a first portion corresponding to a position of said gap and a second portion having a dimension greater than said first portion and disposed to intersect an axis of said support member.

3. The vibration actuator according to claim 2, wherein said support member is a parallel pin.

4. The vibration actuator according to claim 2, wherein said support member is a spring pin.

5. The vibration actuator according to claim 2, wherein said rod-shaped vibration element is formed through combination of plural elastic members.

6. The vibration actuator according to claim 1, wherein said support member is located in a nodal position of the torsional vibration or the longitudinal vibration generated in said vibration element.

7. The vibration actuator according to claim 1, wherein said support member is located in a vicinity of a nodal position of the torsional vibration or the longitudinal vibration generated in said vibration element.

8. The vibration actuator according to claim 1, wherein said support member is located between a nodal position of the torsional vibration and a nodal position of the longitudinal vibration generated in said vibration element.

9. The vibration actuator according to claim 1, further comprising:
plural support members to connect said vibration element and said fixed member.

10. The vibration actuator according to claim 1, wherein said support member is a parallel pin or a spring pin.

11. The vibration actuator according to claim 1, wherein said rod-shaped vibration element is formed through combination of plural elastic members.

12. The vibration actuator according to claim 1, wherein said support member has a rod shape.

13. A vibration actuator, comprising:
a hollow rod-shaped vibration element having an inner surface defined along an axis, said vibration element to generate a second order torsional vibration around the axis and a first order longitudinal vibration in the axial direction;
a fixed member passing through said vibration element, wherein said fixed member is arranged to have a gap with respect to said vibration element;
a relative motion member in compressive contact with an end surface of said vibration element; and
a support member to fix said vibration element and said fixed member,
wherein said support member passes through said vibration element and said fixed member, and elastically deforms in the gap.

14. The vibration actuator according to claim 13, wherein said support member fixes said vibration element and said relative motion member in a nodal position of the first order longitudinal vibration generated in said vibration element.

15. The vibration actuator according to claim 13, wherein said support member fixes said vibration element and said relative motion member in a nodal position close to said relative motion member within plural nodes of the second order torsional vibration generated in said vibration element.

16. The vibration actuator according to claim 13, wherein said rod-shaped vibration element is formed through combination of plural elastic members.

17. The vibration actuator according to claim 13, wherein said support member has a rod shape.

18. A vibration actuator, comprising:
a hollow rod-shaped vibration element having an inner surface defined along an axis, said vibration element to generate a first or higher order torsional vibration about the axis and a first or higher order longitudinal vibration in the axial direction;
a fixed member passing through said vibration element, wherein said fixed member is arranged to have a gap with respect to said vibration element;
a relative motion member in compressive contact with an end surface of said vibration element; and
a support member to connect said vibration element to said fixed member, including a first portion corresponding to a position of said gap and a second portion having a dimension greater than said first portion intersecting an axis of said support member,
wherein said support member elastically deforms in the gap.

19. The vibration actuator according to claim 18, wherein said support member is a parallel pin or a spring pin.

20. The vibration actuator according to claim 18, wherein said rod-shaped vibration element is formed through combination of plural elastic members.

* * * * *